(12) United States Patent
Huebner et al.

(10) Patent No.: US 11,782,088 B2
(45) Date of Patent: Oct. 10, 2023

(54) DEVICES, METHODS AND SAMPLE HOLDER FOR TESTING PHOTONIC INTEGRATED CIRCUITS AND PHOTONIC INTEGRATED CIRCUITS

(71) Applicant: Carl Zeiss SMT GmbH, Oberkochen (DE)

(72) Inventors: Philipp Huebner, Hamburg (DE); Stefan Richter, Jena (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 957 days.

(21) Appl. No.: 16/516,400

(22) Filed: Jul. 19, 2019

(65) Prior Publication Data

US 2019/0339327 A1    Nov. 7, 2019

Related U.S. Application Data

(63) Continuation of application No. PCT/EP2018/051939, filed on Jan. 26, 2018.

(30) Foreign Application Priority Data

Jan. 27, 2017  (DE) .......................... 102017101626.0

(51) Int. Cl.
  *G01R 31/00*  (2006.01)
  *G01R 31/317*  (2006.01)
  *G02B 6/34*  (2006.01)

(52) U.S. Cl.
  CPC ......... *G01R 31/31728* (2013.01); *G02B 6/34* (2013.01)

(58) Field of Classification Search
  CPC ... G01R 31/31728; G02B 6/34; H04B 10/116
  See application file for complete search history.

(56) References Cited

U.S. PATENT DOCUMENTS

| | | | |
|---|---|---|---|
| 8,116,624 B1* | 2/2012 | Wach | H04B 10/073 398/28 |
| 9,453,723 B1 | 9/2016 | LeMaitre et al. | |
| 2003/0117614 A1* | 6/2003 | Kikuchi | G01M 11/35 356/73.1 |
| 2011/0273719 A1 | 11/2011 | Froggatt | |
| 2012/0127467 A1* | 5/2012 | Ivanov | G01N 21/94 356/326 |

(Continued)

FOREIGN PATENT DOCUMENTS

| | | | |
|---|---|---|---|
| DE | 102010029612 A1 * | 12/2011 | ............. G02B 6/124 |
| DE | 102010029612 A1 | 12/2011 | |

(Continued)

OTHER PUBLICATIONS

Herbert Gross, "Handbook of Optical Systems," Fundamentals of Technical Optics, Wiley-VCH, vol. 1, pp. 442-447.

(Continued)

*Primary Examiner* — Pranesh K Barua
(74) *Attorney, Agent, or Firm* — Fish & Richardson P.C.

(57) ABSTRACT

Methods and apparatuses for testing a photonic integrated circuit and a corresponding sample holder and a photonic integrated circuit are provided. Here, a location for an illumination light beam can be selected by way of a scanning device, with the result that targeted coupling of the illumination light into the photonic integrated circuit is made possible.

21 Claims, 13 Drawing Sheets

(56) References Cited

U.S. PATENT DOCUMENTS

| | | | | |
|---|---|---|---|---|
| 2012/0127552 A1* | 5/2012 | Murayama | ........... | G02B 26/101 |
| | | | | 359/201.2 |
| 2014/0043050 A1 | 2/2014 | Stone et al. | | |
| 2014/0147079 A1 | 5/2014 | Doerr et al. | | |
| 2015/0055138 A1* | 2/2015 | Hughes | ................... | G01S 17/66 |
| | | | | 356/482 |

FOREIGN PATENT DOCUMENTS

| | | |
|---|---|---|
| EP | 1517173 B1 | 3/2005 |
| EP | 3002568 A1 | 4/2016 |
| JP | 2003-185526 A | 7/2003 |
| JP | 2011-145628 A | 7/2011 |
| JP | 2012-108372 A | 6/2012 |
| JP | 2012-515350 A | 7/2012 |
| WO | WO 2015/187014 A1 | 12/2015 |

OTHER PUBLICATIONS

International Search Report for corresponding PCT App No. PCT/EP2018/051939, dated Apr. 25, 2018.
Japanese Office Action, with translation thereof, for corresponding Appl No. 2019-560486, dated Sep. 7, 2020.
Japanese Office Action, with translation thereof, for corresponding JP Appl No. 2019-560486, dated Jul. 8, 2021.

* cited by examiner

DEVICES, METHODS AND SAMPLE HOLDER FOR TESTING PHOTONIC INTEGRATED CIRCUITS AND PHOTONIC INTEGRATED CIRCUITS

FIELD

The present application relates to apparatuses, methods and sample holders for testing photonic integrated circuits (PIC) and to photonic integrated circuits set up for such tests.

BACKGROUND

In photonic integrated circuits, in a manner similar to that in the case of electronic integrated circuits, a multiplicity of passive and/or active optical and optoelectronic components are assembled on a common substrate, for example a semiconductor wafer, to form complex optical circuits. In this case, traditional optical components such as filters or couplers, for example, can be replaced by more compact integrated optical components. The various components of the photonic integrated circuit are connected to one another via waveguides near the surface of the photonic integrated circuit. Such photonic integrated circuits have become more interesting for example in recent years with the major growth in data traffic on the Internet, since signal processing circuits which have sufficient bandwidth and which operate efficiently are used here. Apart from telecommunications and data transmission applications, photonic integrated circuits are also of interest for other applications such as sensor technology and for applications in the life sciences.

The production process of such photonic integrated circuits resembles the production process of conventional electronic integrated circuits or microelectromechanical systems (MEMS). In contrast to these conventional technologies, however, for photonic integrated circuits only a small number of test methods exist that can be used to efficiently check such circuits during the production process or afterward.

For testing the photonic integrated circuits, in particular the waveguide structures located therein, it is desirable to couple light into the waveguide structures of the photonic integrated circuit and to detect light from the photonic integrated circuit, in particular from the waveguide structures.

It is conventional practice for this purpose for light-guiding fibers, for example glass fibers, to be aligned and thus positioned with respect to the photonic integrated circuit to be tested. Since this involves a high accuracy in the range of less than 1 μm, a comparatively long time is involved for this, which makes the testing very time-consuming. Therefore, such testing is suitable only to a limited extent for high numbers, or is time- and cost-intensive for such numbers, since the positioning has to be carried out before each test and for each circuit separately.

For these reasons, present-day tests of photonic integrated circuits are restricted mainly to topological analyses and functional checking of the finished components.

SUMMARY

The application seeks to provide improved possibilities for testing such photonic integrated circuits.

According to a first aspect, an apparatus for testing photonic integrated circuits includes: a light source for producing an illumination light beam; an illumination path for steering the illumination light beam onto a photonic integrated circuit, wherein the illumination path includes a scanning device for selecting an illumination location; and a detection device having a detection path for detecting detection light coming from the photonic integrated circuit (in particular coupled out, reflected and/or scattered) as a reaction to the illumination light beam (that is to say detection light coming from the photonic integrated circuit).

The word "light" here includes both light in the visible range and light outside it, e.g., infrared light. "Detection light" refers to the light that is to be detected coming from the photonic integrated circuit as a reaction to the illumination.

A scanning device is here generally a device with which a surface, in this case the photonic integrated circuit or the area around it, can be scanned using a light beam or the light beam can be positioned with targeted precision on an input coupling structure of a waveguide of the photonic integrated circuit. By providing such a scanning device, no mechanical alignment of glass fibers is necessary, and input coupling can be effected with targeted precision via the scanning device.

The apparatus can furthermore include a pupil selection device for defining a position of the illumination light beam in a pupil plane of the illumination path in order to set an illumination angle in this manner.

A pupil selection device in this case limits the light beam to a portion of a pupil of an optical unit used for illuminating the photonic integrated circuit. It is possible hereby to set not only the location of the illumination but also an angle of incidence onto the photonic integrated circuit.

The pupil selection device can include a first adjustable mirror device and a second adjustable mirror device, for example a first biaxially adjustable mirror and a second biaxially adjustable mirror, two pairs of uniaxial mirrors, for example mirrors having a galvanometric drive (also referred to as galvo mirror), acousto-optic modulators and/or acousto-optic deflectors. An adjustable mirror device is here generally a device that deflects light, with the light deflection, for example an angle of the light deflection, being adjustable.

Additionally or alternatively, the pupil selection device can include a spatial light modulator.

The spatial light modulator can be set up to produce at least two illumination light beams. Thus, simultaneous input coupling at different sites of the photonic integrated circuit is possible.

The detection device can include a 2D detector, that is to say a detector with which light can be detected areally and in particular in spatially resolved fashion by the photonic integrated circuit.

The 2D detector can include an image sensor, for example a CCD sensor or a CMOS sensor.

Additionally or alternatively, the detection device can include a point detector.

The detection device can also include a spectrometer and/or an optical reflectometer operating in the time domain.

The detection path for the detection light can include the scanning device. In this case, the detection light can be detected at the illumination location.

The detection path for the detection light can, however, also include a further scanning device. In this case, the detection light can be detected at a location that is settable independently of the illumination location.

In accordance with a second aspect, a sample holder for an apparatus as described above is provided, wherein the sample holder includes a receptacle for the photonic integrated circuit and a beam deflection device, arranged around the receptacle, for deflecting a light beam to or from the apparatus. Such a sample holder can be used to couple light in particular laterally into the photonic integrated circuit or out of it. "Around" in this context means that the beam deflection device is arranged at sides of the receptacle such that, when a photonic integrated circuit is arranged in the receptacle, the beam deflection device is arranged laterally of the integrated circuit and surrounds the latter entirely or partially.

The beam deflection device can include a prism and/or a mirror.

According to a further aspect, a photonic integrated circuit for use with an apparatus as described above is provided, wherein the photonic integrated circuit includes at least one waveguide plane and at least one coupling grating that is arranged on a surface of the photonic integrated circuit that is parallel with respect to the waveguide plane. The coupling grating can be used to couple the illumination light beam from the apparatus into the waveguide plane and to couple out the detection light.

According to a further aspect, a method for testing a photonic integrated circuit includes: selecting an illumination location of an illumination light beam for illuminating the photonic integrated circuit with a scanning device; and detecting detection light coming from the photonic integrated circuit.

Such methods can be used to quickly and cost-effectively examine photonic integrated circuits.

The method can furthermore include selecting an illumination angle of the light beam by setting a position of the illumination light beam in a pupil plane of an illumination path for the illumination light beam.

The method can furthermore include selecting a detection location for the detection light.

BRIEF DESCRIPTION OF THE DRAWINGS

The disclosure is explained in more detail below on the basis of exemplary embodiments. In the figures.

DESCRIPTION OF EXEMPLARY EMBODIMENTS

The disclosure will be explained in detail below on the basis of various exemplary embodiments. It should be noted that these exemplary embodiments only serve illustrative purposes and should not be construed as limiting. It should also be noted that paths for coupling light into a photonic integrated circuit (illumination paths) and paths for detecting light (detection paths) coming from photonic integrated circuits will be discussed separately with reference to the different variants of the apparatuses illustrated below. These excitation and detection paths can be combined substantially as desired.

In addition, other optical components in addition to the illustrated optical components can be provided. For example, light paths (illumination or detection paths) can exhibit one or more angles realized by one or more mirrors, for example to make a more compact construction possible. Lenses that are illustrated merely serve as an example and can also be realized as groups of lenses and/or of other beam-shaping elements, for example diffractive elements, as long as the desired function of the respective optical elements is maintained.

Figure 1:
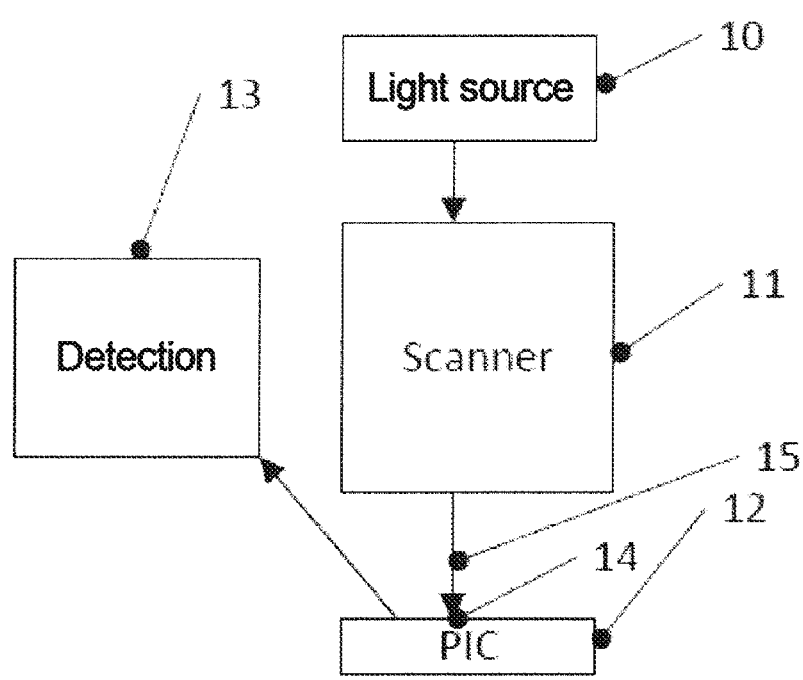
FIG. 1 shows a block diagram of an apparatus in accordance with one exemplary embodiment.

FIG. 1 shows a block diagram of an apparatus in accordance with one exemplary embodiment. The apparatus of FIG. 1 includes a light source 10 for generating a light beam 15 (the designation light beam is used here for easier designation, and includes the possibility of a plurality of partial light beams and/or a beam bundle). In one preferred exemplary embodiment, the light source 10 is a laser light source. In some exemplary embodiments, the light source 10 can generate polarized light, for example via a polarizer, in order to illuminate a photonic integrated circuit 12 with polarized light.

The apparatus of FIG. 1 furthermore includes a scanning device 11 via which a position 14 of the light beam on the photonic integrated circuit 12 is able to be changed. For this purpose, the scanning device 11 can have in particular one or more moveable scanning mirrors and/or spatial light modulators. It is hereby possible using the scanning device 11 to precisely set the position 14 without the positioning of glass fibers or other light-guiding fibers being desireable as in know approaches.

The scanning device 11 preferably also makes possible setting of the angle at which the light beam 15 is incident on the photonic integrated circuit 12, with the result that for example a suitable input coupling angle for waveguide structures of the photonic integrated circuit 12 can be selected. As will be explained in more detail below, this can be done in particular via a pupil selection device via which the light beam 15 is moved in a pupil plane of an optical unit of the scanning device 11. In other words, not the entire pupil for example of an objective used is utilized, as a result of which the angle of incidence and the angular spectrum of the light beam 15 (that is to say of partial light beams thereof) are settable within specific limits. This will be explained in greater detail later.

The apparatus of FIG. 1 furthermore includes a detection device 13 with which light coming from the photonic integrated circuit 12, in particular light from waveguide structures of the photonic integrated circuit 12, can be detected. This detection can be effected simultaneously for the entire photonic integrated circuit 12, for example via a camera or another 2D sensor, or in spatially resolved fashion, for example using a further scanning device.

The light path with the light source 10 and the scanning device 11 that serves for illuminating the photonic integrated circuit 12 with the light beam 15 will also be referred to below as the illumination path, and the light path for detection with the detection device 13 will be referred to as the detection path. Various exemplary embodiments for the implementation of the illumination path and of the detection path will be explained below with reference to FIGS. 2-9, wherein possible implementations for the illumination path will be explained with reference to FIGS. 2-5 and possible implementations for the detection path will be explained with reference to FIGS. 6-9. In order to avoid repetition, mutually corresponding elements will bear the same reference signs in FIGS. 2-9 and will not be explained more than once. The illumination and detection paths described in part use principles known from laser scanning microscopy (LSM) and transfer them to the testing of photonic integrated circuits. For that reason, other elements that are not illustrated in the figures but are conventionally used in laser scanning microscopes can also be used in exemplary embodiments of the present disclosure.

Figure 2:
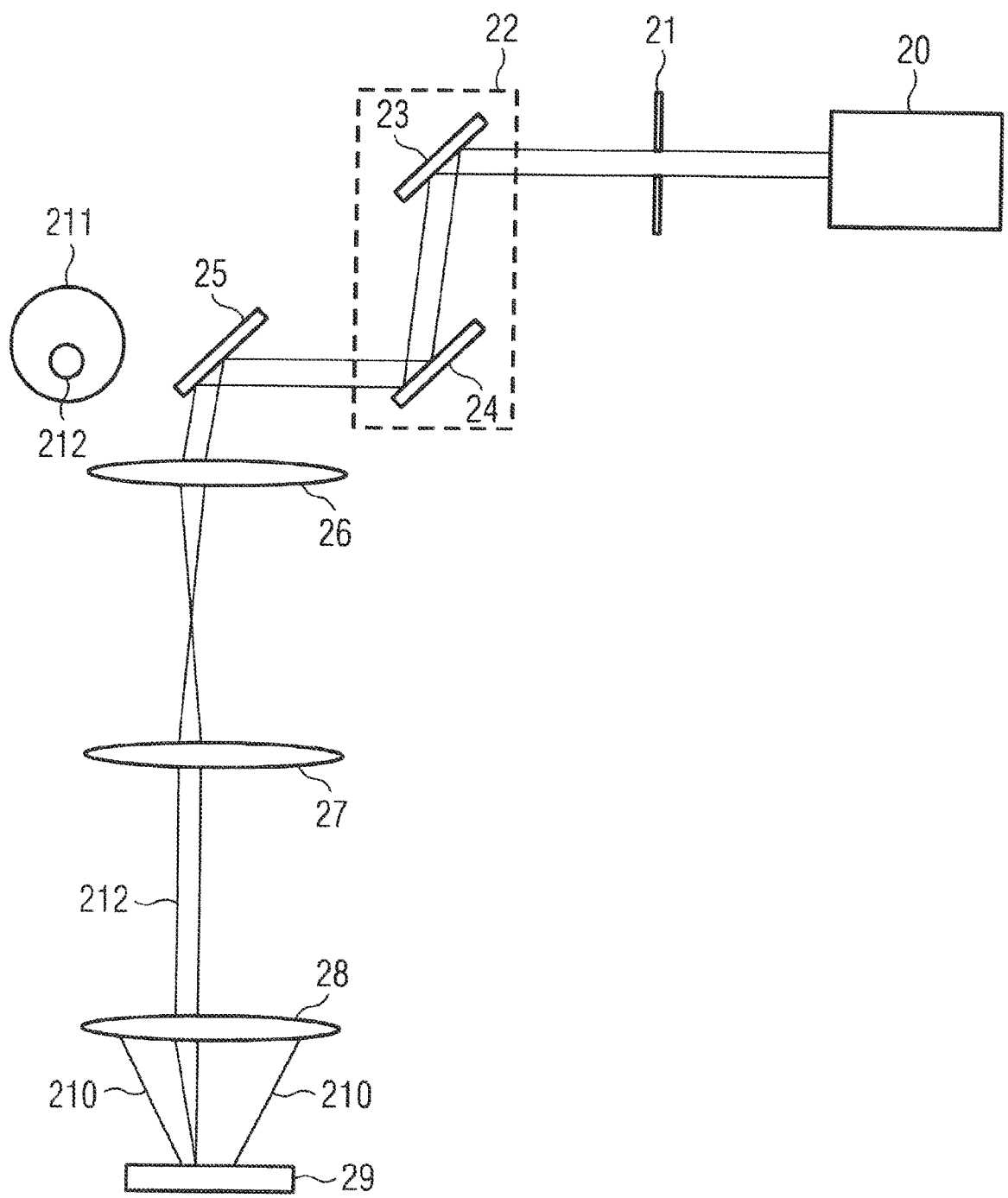
FIGS. 2-5 show illumination paths for apparatuses in accordance with various exemplary embodiments.

FIG. 2 shows an illumination path of an apparatus for testing a photonic integrated circuit 29 in accordance with an exemplary embodiment. The apparatus in FIG. 2 includes a laser 24 for generating an illumination light beam 212 that serves to illuminate the photonic integrated circuit 29, in particular to be coupled into a waveguide of the photonic integrated circuit 29. The laser 20 can here generate light with a desired polarization, to which end polarizers (not illustrated) or polarization-rotating elements can also be provided.

The light beam emanating from the laser 20 is set (delimited) by an aperture stop 21 with respect to the aperture thereof and then passes to a beamwalk device 22 having mirrors 23, 24, the function of which will be explained in more detail below. The illumination beam 212 passes from the beamwalk device 22 to a scanning mirror 25 that is movable, in particular tiltable, as a result of which it is possible to set a position of the light beam 212 on or at the photonic integrated circuit 29. Instead of the aperture 21, it is also possible for a beam expansion/beam restriction arrangement, for example similar to a telescope arrangement, to be provided. The scanning mirror 25 can be realized in different ways, for example by way of a galvanic mirror, one or more micromechanical mirrors or spatial light modulators. In general, any element that makes controllable deflection of the light beam 212 possible can be used as a scanning mirror 25.

The illumination light beam 212 is imaged from the scanning mirror 25 via a scanning lens 26, a tube lens 27 and an objective lens 28 onto the photonic integrated circuit 29, wherein the photonic integrated circuit 29 in the exemplary embodiment of FIG. 2 is located in a focal point of the optical arrangement formed by the lenses 26, 27 and 28. This optical arrangement should be understood to be merely an example of a lens arrangement, and other lens arrangements can be used, for example other lens arrangements conventionally used in laser scanning microscopes. The reference sign 210 designates "marginal rays" of the objective lens 28.

As already explained, it is possible by way of the scanning mirror 25 to set a position of the illumination light beam 212 on the photonic integrated circuit 29. It is additionally possible, as will now be explained, to set an angle of incidence of the light beam 212 on the photonic integrated circuit 29 by way of the beamwalk device 22.

On account of the restriction of the aperture by way of the aperture stop 21, the light beam 212 fills only part of a pupil plane 211, wherein the scanning mirror 25 is arranged in the pupil plane. The lenses 26, 27 here serve to "relocate," as it were, the pupil plane of the objective lens 28 to the location of the scanning mirror 25. The beamwalk device 22 includes the mirrors 23 and 24, wherein in the exemplary embodiment of FIG. 2 the mirrors 23 and 24 are biaxially tiltable. Other displacement options or tilt options of the mirrors 23, 24 are likewise able to be realized. By moving the mirrors 23 and/or 24, the light beam 212 can be displaced in the pupil plane 211. This changes the angle of incidence of the light beam 212 on the photonic integrated circuit 29. It is thus possible in this manner to also change the angle of incidence of the light beam 12 on a photonic integrated circuit by utilizing only a part of the pupil plane. The aperture stop 21 can be adjustable here. In this way, an "angular spectrum" or angle range at which the light beam 212 is incident on the photonic integrated circuit 29 can be selected.

By moving the scanning mirror 25, it is here possible in particular for the light beam 212 to be directed at input coupling locations of the photonic integrated circuit 29, for example input coupling gratings.

Figure 3:
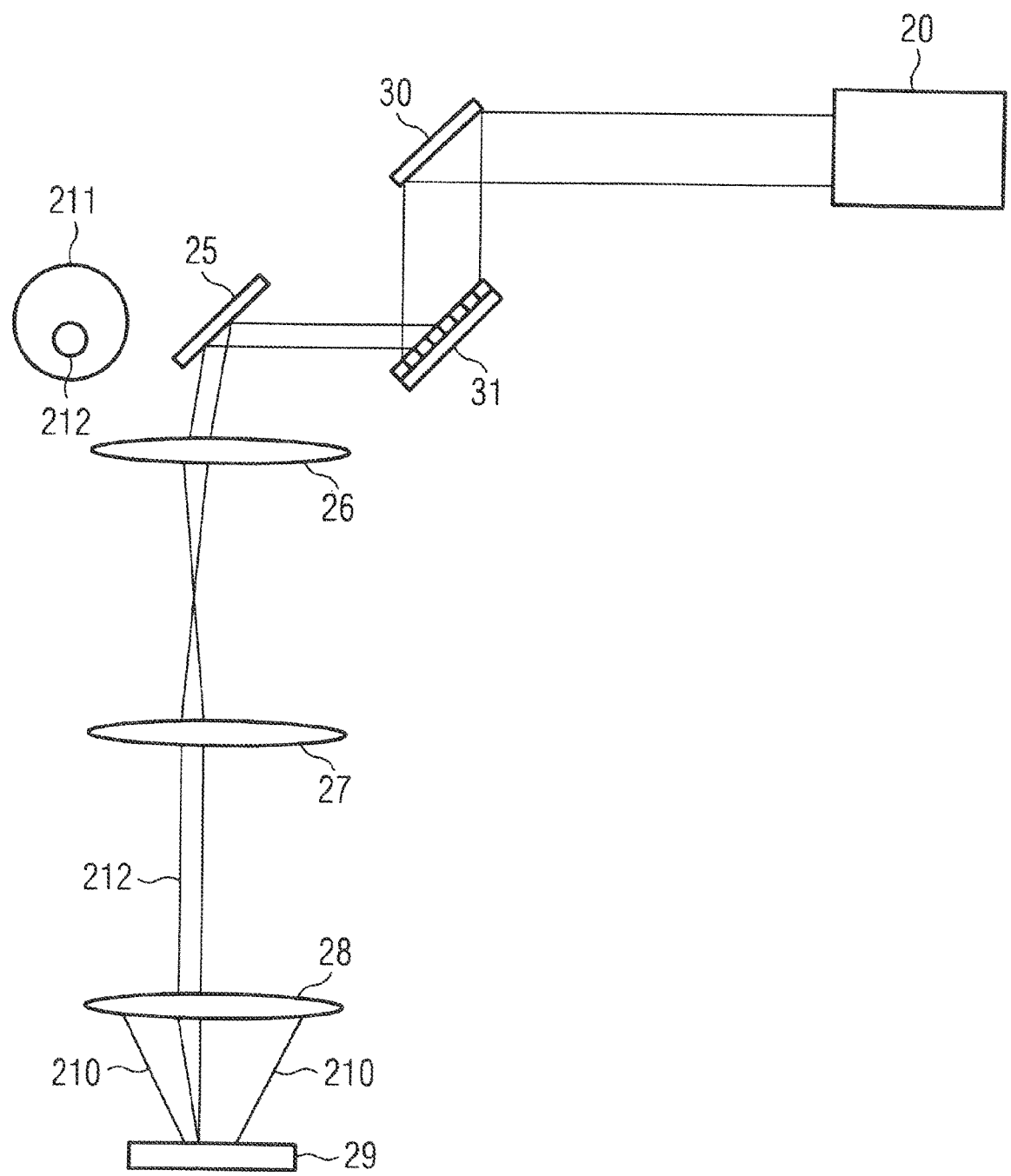

FIG. 3 shows an alternative to the provision of the aperture stop 21 and the beamwalk device 22. Instead of these elements, in the exemplary embodiment in FIG. 3 a mirror 30 together with a spatial light modulator 31 is provided. The spatial light modulator (SLM) 31 can take the form, for example, of a digital micromirror device (DMD), a liquid-crystal display (LCD), or liquid crystal on silicon (LCoS). The spatial light modulator 31 can be used to select a part of the light beam emitted by the laser 20 as the light beam 212, with the result that again only a selectable part of the pupil 211 is used and an illumination angle is settable.

Some spatial light modulators, for example LCD and LCoS modulators, additionally make it possible to set the phase of the light beam and consequently make possible great freedoms in beam-shaping, for example multiple beam arrangements or Bessel beams, which are beneficial for some examinations and tests of photonic integrated circuits.

Figure 4:
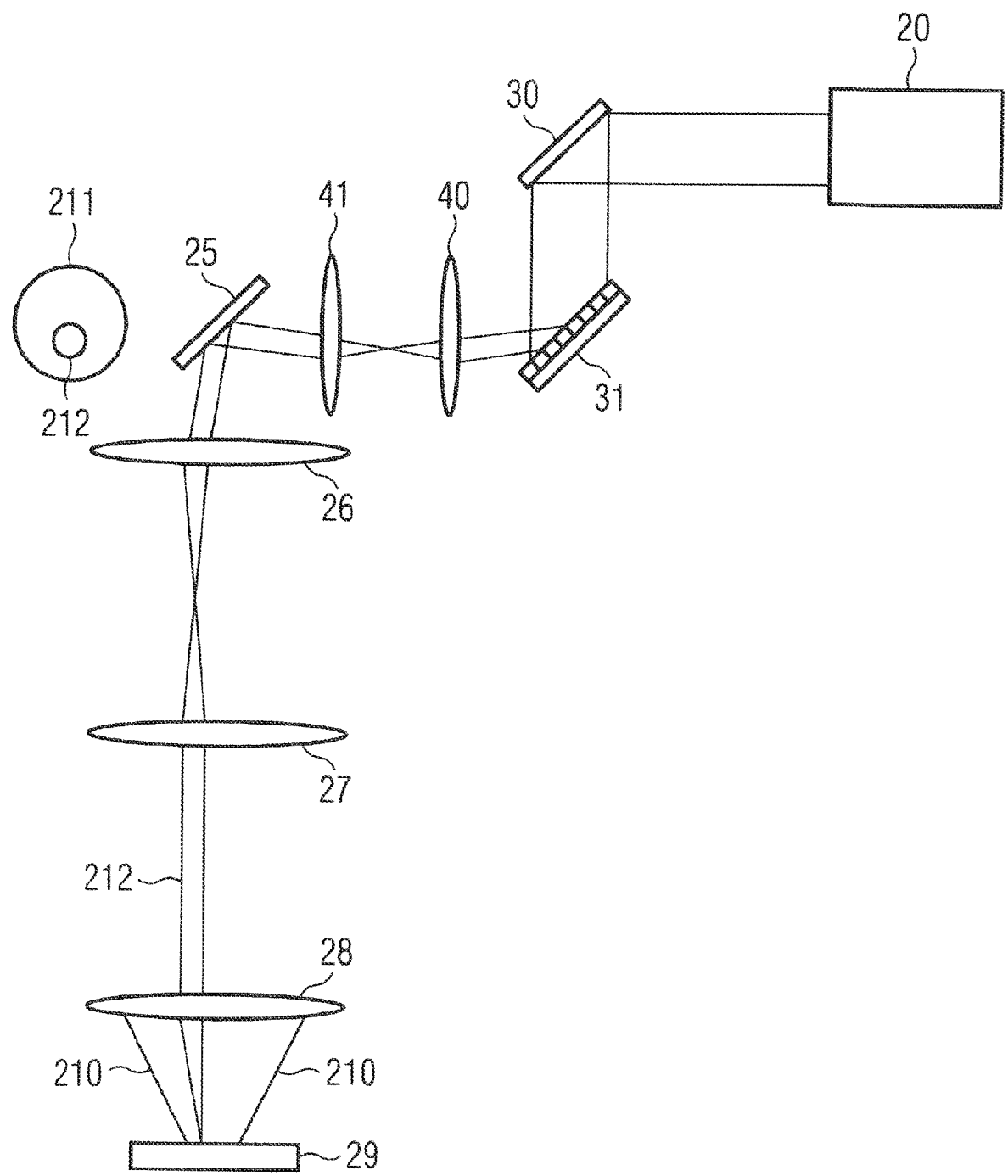

A variant of the exemplary embodiment of FIG. 3 is depicted in FIG. 4. In FIG. 4, lenses 40, 41 are arranged between the spatial light modulator 31 and the scanning mirror 25, the lenses 40, 41 making possible additional beam-shaping. The latter constitute an example of additional optical elements that can be arranged in the illumination path.

Figure 5:
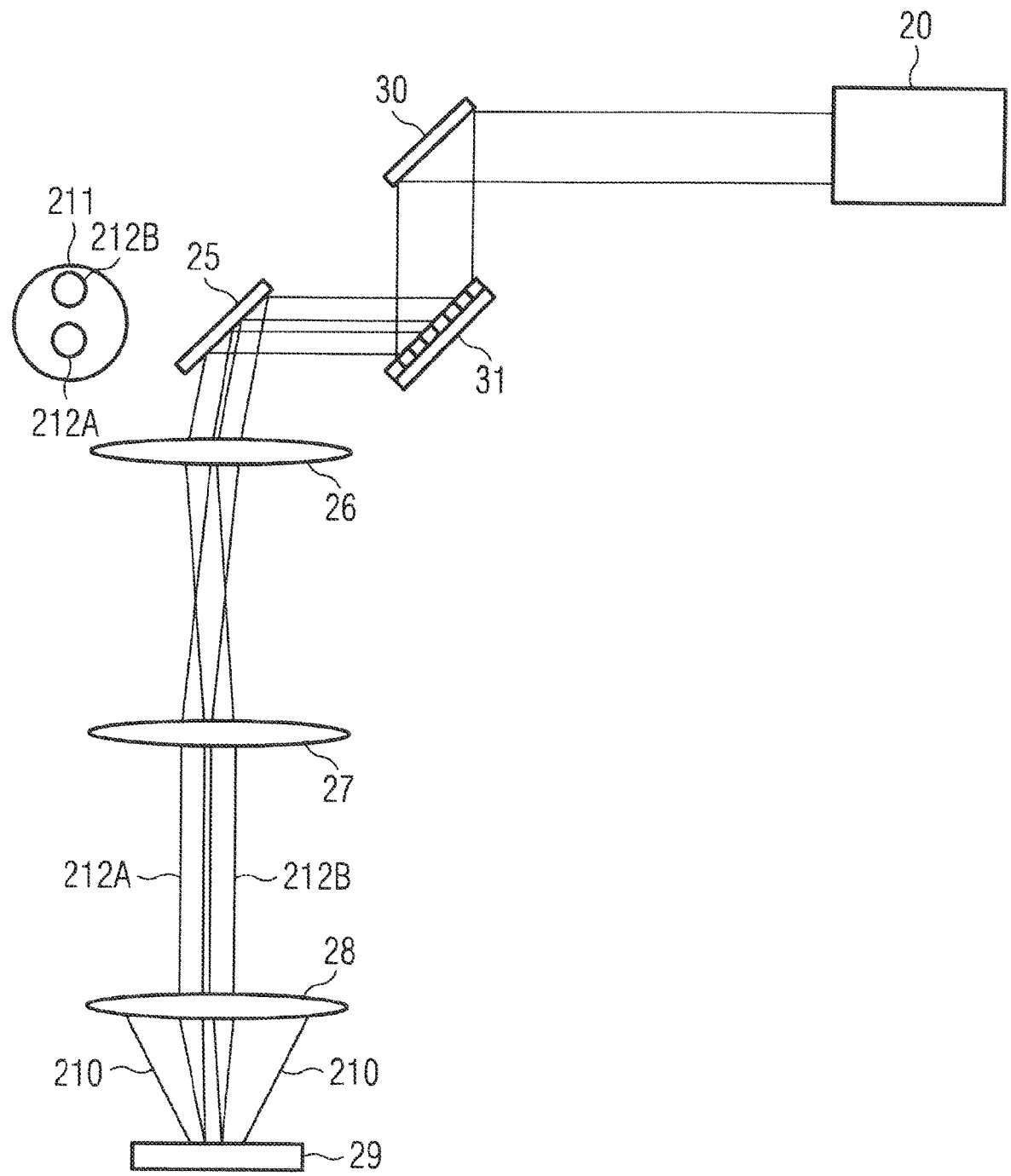

FIG. 5 shows a possible use of the exemplary embodiment of FIG. 3 for illuminating the photonic integrated circuit 29 at several points. Here, the spatial light modulator 31 is used to produce two illumination light beams 212A, 212B at different sites of the pupil 211, resulting in the illumination of the photonic integrated circuit at two different locations. In this way, light can be coupled in parallel into the photonic integrated circuit 29 at a plurality of locations, providing additional test options. It should be noted that the number of two separate illumination light beams is only an example, and more than two beams can be produced by way of the spatial light modulator 31.

Next, with reference to FIGS. 6-9 (9A and 9B), various options for detecting from the photonic integrated circuit 29 as a reaction to the illumination of emanating detection light will be explained. The illumination path of FIG. 2 is used in FIGS. 6-9 as an example of an illumination path. However, in other exemplary embodiments it is likewise possible to use the illumination path of one of the exemplary embodiments of FIGS. 3-5. In general, the detection path is not required to meet such strict desired coupling properties in terms of angle and possibly polarization as the illumination path.

Figure 6:
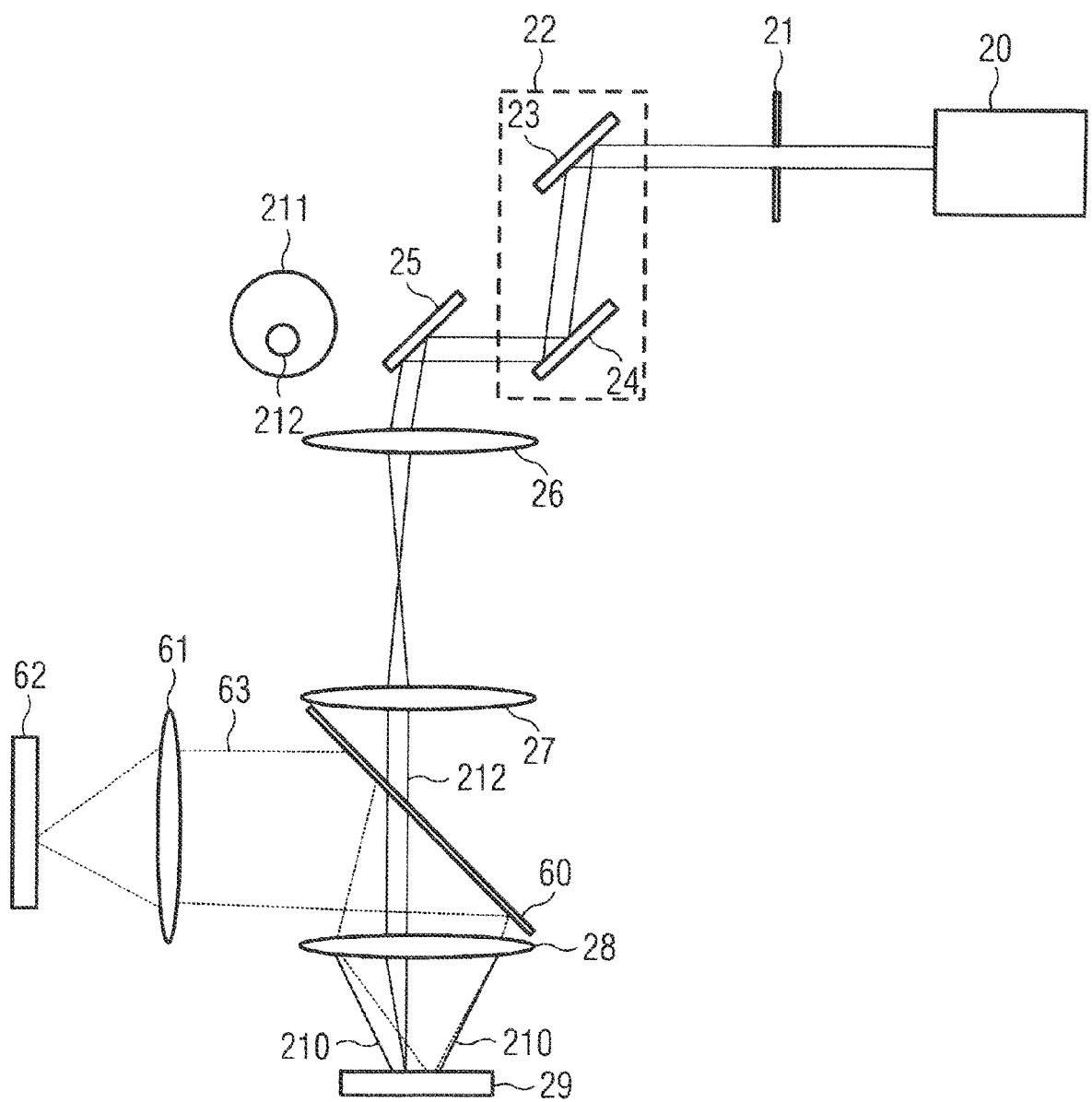
FIGS. 6, 7, 8, 9A and 9B show apparatuses in accordance with various exemplary embodiments having different detection paths.

In the exemplary embodiment of FIG. 6, a 2D detector 62, that is to say a surface detector such as an image sensor, for example a CCD image sensor or CMOS image sensor, is used to perform detection within a large field of view (FOV). To this end, in the exemplary embodiment of FIG. 6, a beam splitter 60 is provided that couples the detection light 63 coming from the photonic integrated circuit 29 out of the illumination path. The detection light 63 is then imaged onto the surface detector 62 by way of a camera lens 61 (which in turn serves only as an example and may also be a camera objective made up of several components). The detector 62 is here arranged in an image plane of the objective that is formed by the lenses 28 and 61 to observe the surface of the photonic integrated circuit 29 or a part thereof. The size of the beam splitter 61 here determines the field of view, inter alia. Such detection using a surface detector and with a large field of view is beneficial in particular when different output coupling ports of an examined waveguide of the photonic integrated circuit are to be observed at the same time that are situated in different positions on the photonic integrated circuit, in particular when they are located at a distance from an input port at which the illumination light beam 212 is coupled in. It should be noted that detection in FIG. 6 presupposes that surface detectors 62 that are suitable for the wavelength used are provided, which can prove difficult for some infrared wavelengths. The test measurements with the apparatus of FIG. 6 are suitable in particular for quality measurements, for example for checking whether an optical signal path in the photonic integrated circuit 29 operates correctly.

A further possibility is what is known as "descanned" detection, in which light passes from the photonic integrated circuit 29 to a scanning device. The detection is then performed by way of a point detector such as a photodiode, an avalanche photodiode, a photomultiplier or another measurement system such as a spectrometer or an optical reflectometer operating in the time domain. Two possibilities are given here. In a first approach, the detection light is detected at the position at which the illumination light beam is incident on the photonic integrated circuit, wherein in this case only one scanning device, for example a scanning mirror, is used both for the illumination path and for the detection path. In a second approach, the locations differ, and accordingly, separate scanning devices are used in this case. The first case will be described below with reference to FIGS. 7 and 8, while the second case will be described with reference to FIGS. 9A and 9B.

Figure 7:
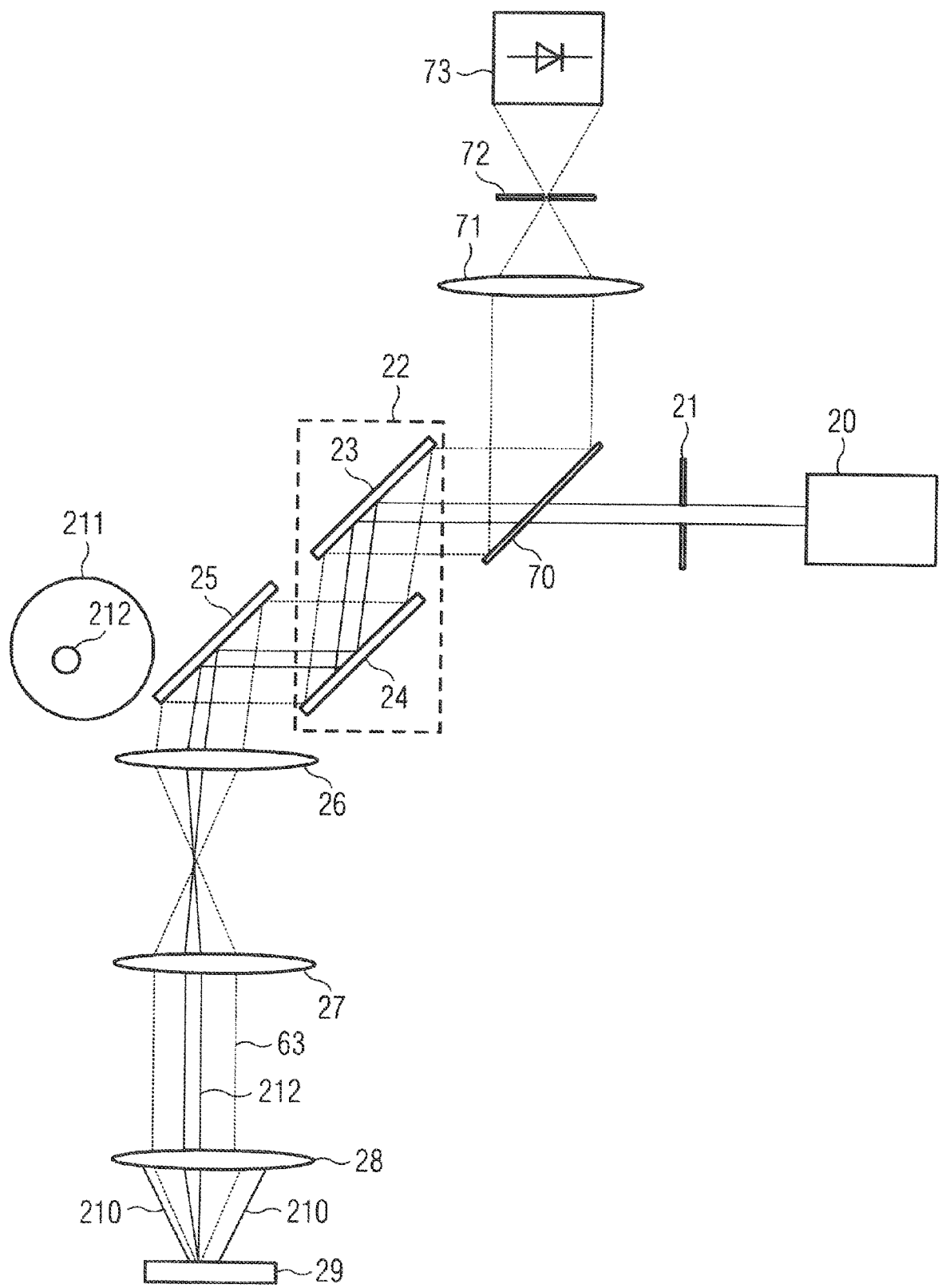

In the exemplary embodiment of FIG. 7, arranged between the beamwalk device 22 and the aperture stop 21 is a beam splitter 70 that images the detection light 63 coming from the photonic integrated circuit 29 out of the illumination path to a lens 71 that images the detection light 63 onto a pinhole 72. The light beam is then detected by a point detector 73.

Figure 8:
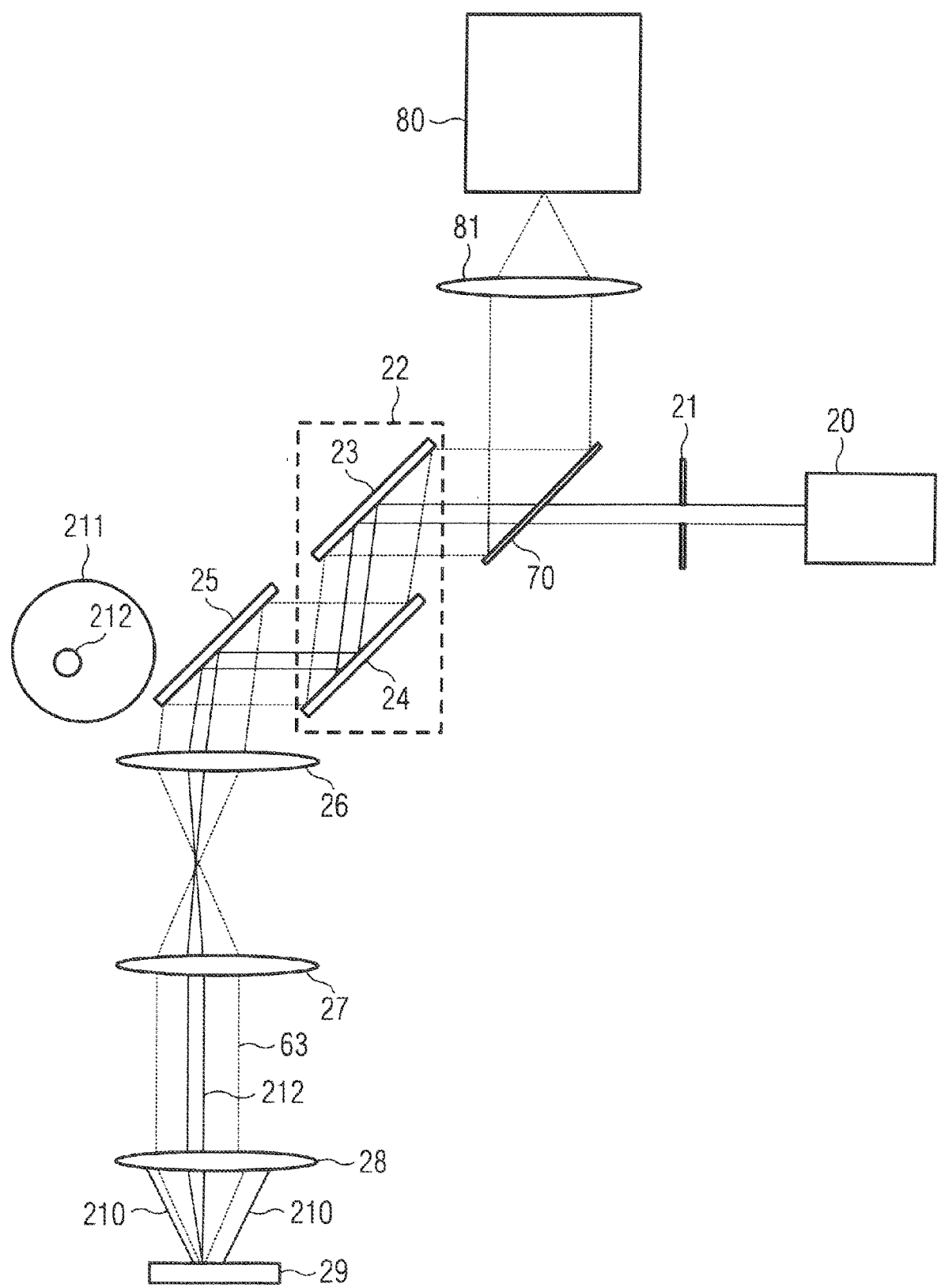

In the exemplary embodiment of FIG. 8, a lens 81 replaces the lens 71, the pinhole 72 and the detector 73, the lens 81 imaging the output coupled detection light 63 onto the entrance of a measurement system 80, for example a spectrometer or an optical reflectometer operating in the time domain, as mentioned above.

The approach of FIGS. 7 and 8 makes it possible to analyze light that is reflected or scattered at the input port that is illuminated by the illumination light beam 212 or within the waveguide structure into which the illumination light beam 212 is coupled. While substantially simple intensity detection is made possible with the detector of FIG. 7, a measurement system such as the measurement system 80 can provide further information, for example a spectral distribution of the light in the case of a spectrometer or an analysis of time-dependent phenomena, such as propagation times within the waveguide structures, by way of a reflectometer operating in the time domain. This can make it possible to reach conclusions relating to the internal structure of the waveguide (for example beam splitter, coupler and other elements that cause a reflection) and to the functionality of the waveguide structure within the photonic integrated circuit.

Figure 9A:
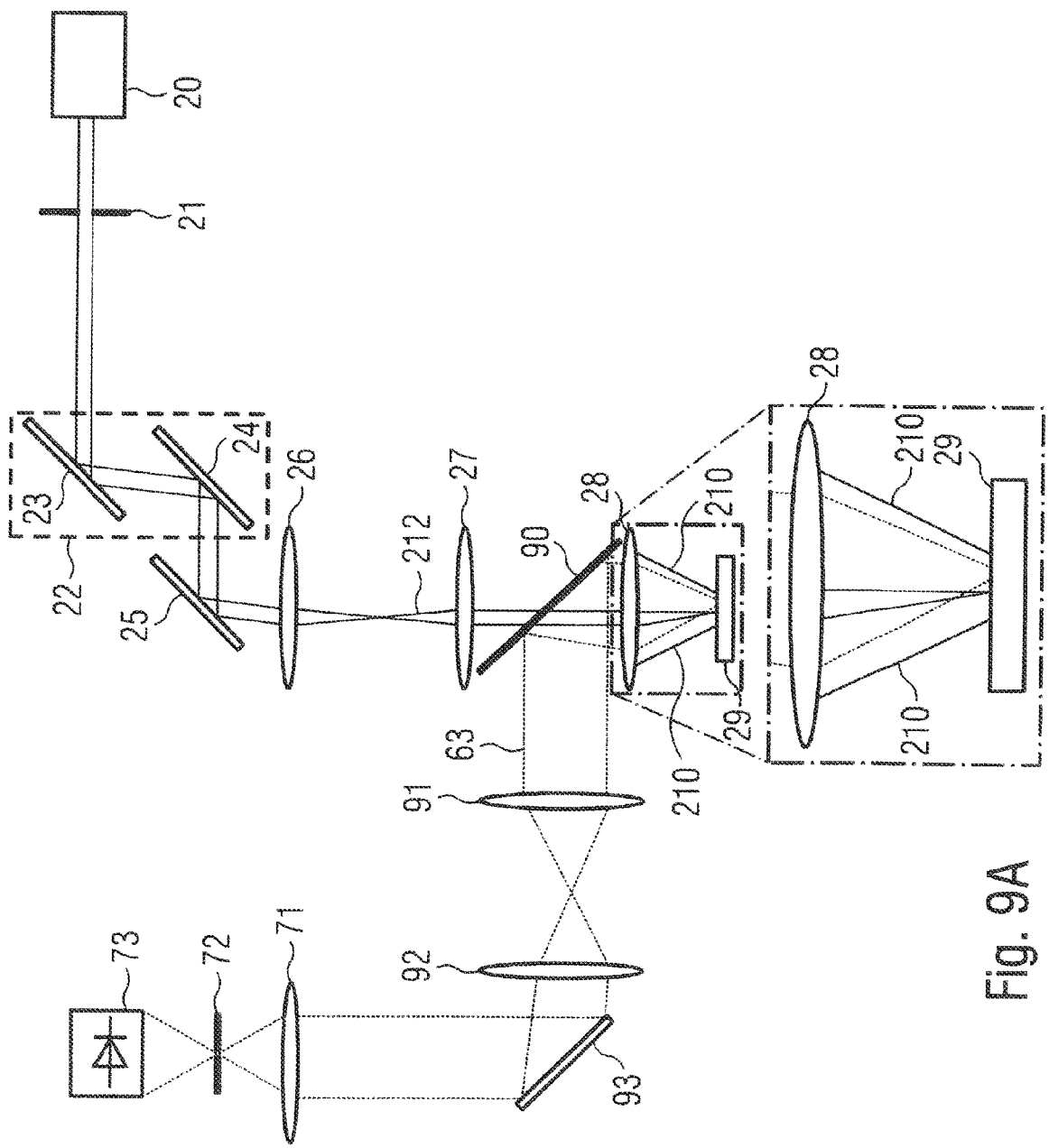
Figure 9B:
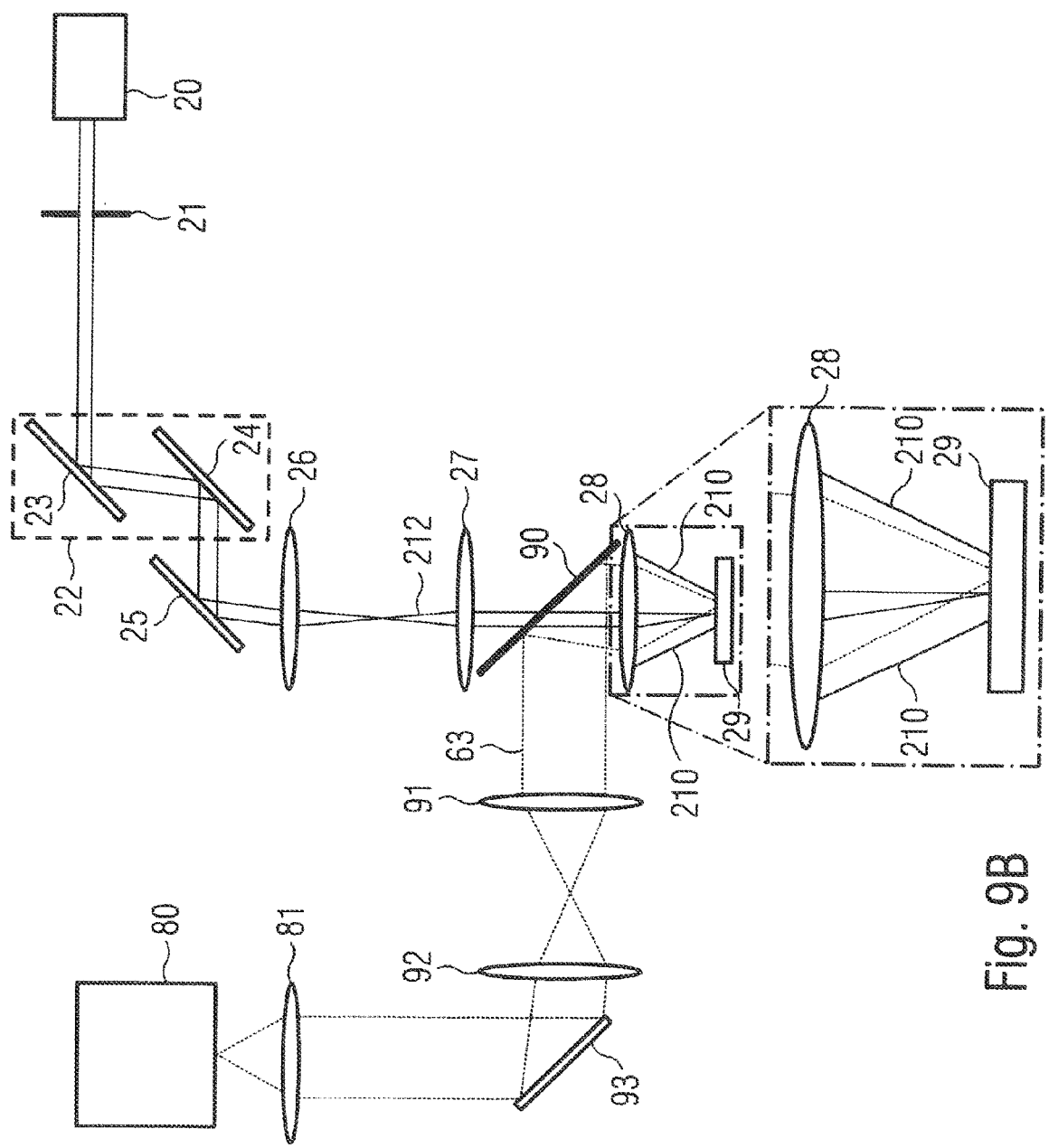

FIGS. 9A and 9B show possibilities for the case in which light coming from the photonic integrated circuit 29 is to be detected at a different location than the one on the photonic integrated circuit 29 at which the illumination light beam 212 is directed. These different locations are apparent in particular in FIGS. 9A and 9B in an additionally illustrated enlarged depiction of the photonic integrated circuit 29, the objective lens 28 and the parts of the light beams located therebetween.

In the exemplary embodiments of FIGS. 9A and 9B, a beam splitter 90 is provided between the objective lens 28 and the tube lens 27, the beam splitter 90 coupling the light coming from the photonic integrated circuit 29 out of the illumination path. The light beam 62 is guided via a further tube lens 91 and a scanning lens 92 to a further scanning mirror 93 or other scanning devices by way of which the detection location on the photonic integrated circuit 29 is able to be changed. The scanning mirror 93 can be designed for example in accordance with the different possibilities which have already been explained for the scanning mirror 25.

In the exemplary embodiment of FIG. 9A, the light is then directed from the further scanning mirror 93 via the combination of the lens 71 and pinhole 72 (already described) to the detector 73 (likewise described). In the exemplary embodiment of FIG. 9B, by contrast, as in the exemplary embodiment of FIG. 8, a lens 81 and a measurement system 80 that can be designed as already described with reference to FIG. 8 are provided. Using the apparatuses of FIGS. 9A and 9B, it is thus possible to test any desired waveguide paths with a freely selectable input and output (selectable via the scanning mirror 29 and the further scanning mirror 93).

Coupling structures and sample holders for photonic integrated circuits that can be used together with the above-described apparatuses for performing test measurements will be described below with reference to FIGS. 10 and 11.

Figure 10A:
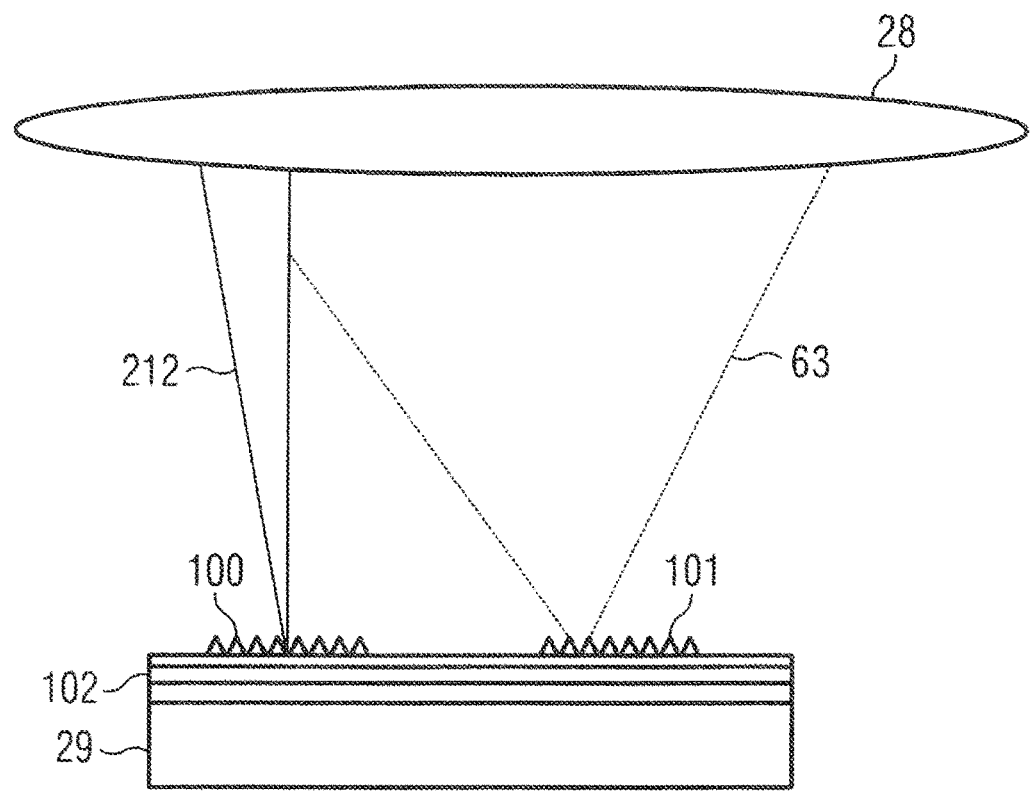
FIGS. 10A, 10B, 11A and 11B show samples and sample holder in accordance with various exemplary embodiments.
Figure 10B:
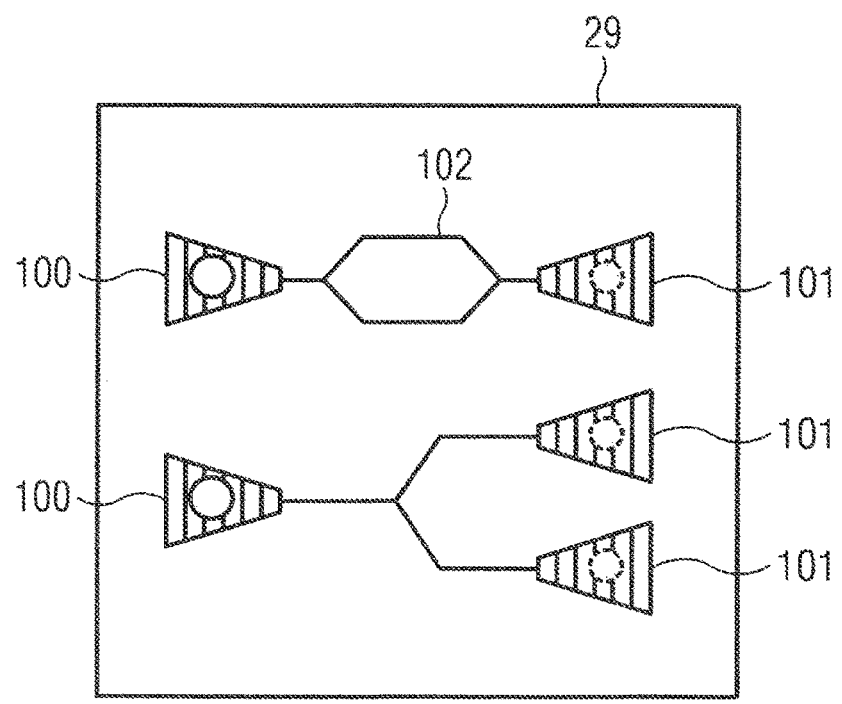

FIG. 10A shows a cross-sectional view of a photonic integrated circuit 29 together with the objective lens 28, the illumination beam path 212 and the detection beam 63, and FIG. 10B shows a plan view of the photonic integrated circuit 29. The photonic integrated circuit 29 in the example of FIGS. 10A and 10B includes waveguide structures 102 that are coupled to further optical components (not illustrated) of the photonic integrated circuit. A coupling grating 100 and an output coupling grating 101 are provided in order to enable the illumination light beam 212 and the detection beam 63 respectively to be coupled into and out of the waveguide structures 102. The various input coupling gratings 100 and if desired also the various output coupling gratings 101 can be "targeted" precisely with the above-described apparatuses by virtue of providing scanner devices in order thus to enable test measurements. The coupling gratings 100, 101 couple light in and out of the plane of the waveguides 102 approximately perpendicular to the surface of the photonic integrated circuit 29. This type of coupling gratings has the advantage that they can be employed for different components both at the wafer level (before the dicing of the wafer) and after distribution. An alternative is edge couplers consisting of beveled waveguides near the chip edge. However, this can only be employed for already diced wafers and singulated chips if these chip peripheries (end facets) are accessible.

Figure 11A:
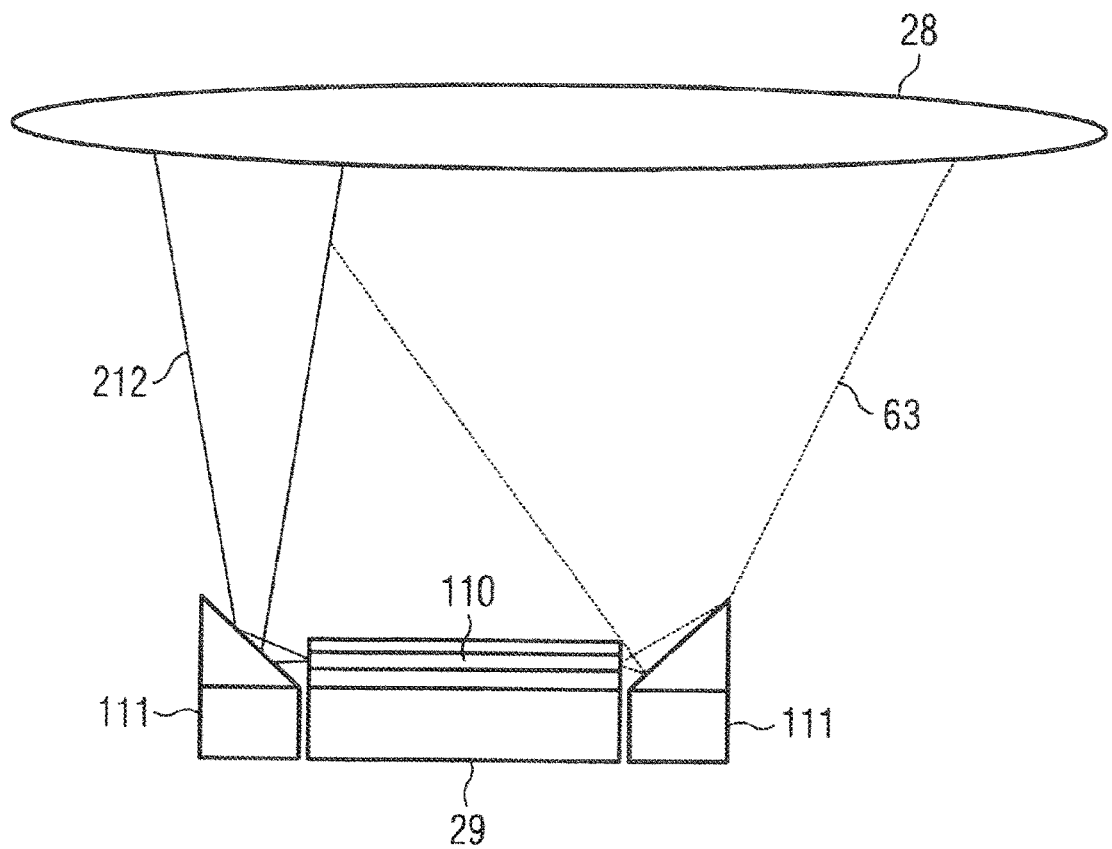
Figure 11B:
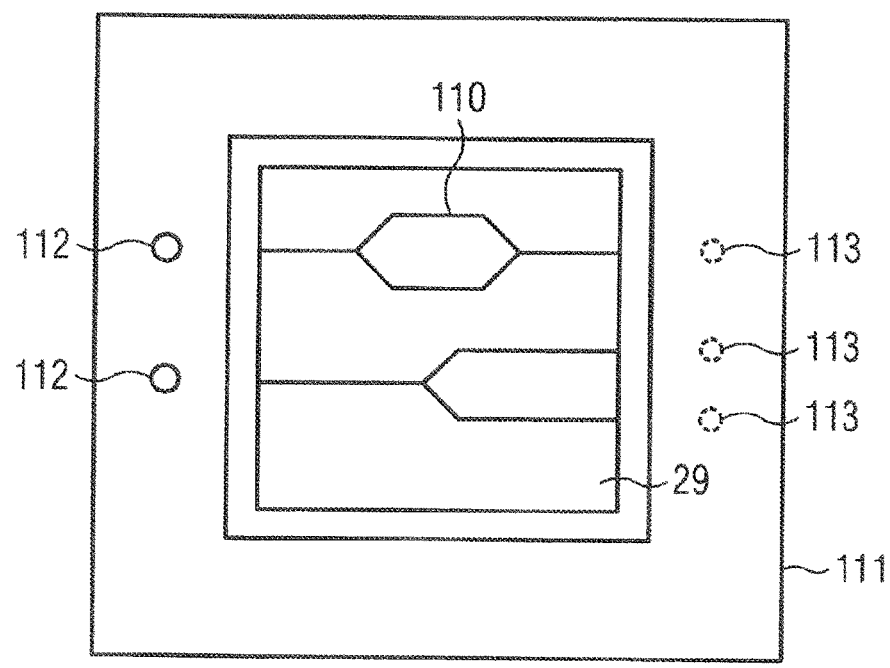

In addition, coupling into end facets of chips is more difficult because in the case of the orientation of the photonic integrated circuit shown in FIGS. 2-9, they are not directly accessible. In some exemplary embodiments, the photonic integrated circuit can be arranged "perpendicularly," that is to say with the periphery facing the optical construction, wherein in this case only one side of the periphery is accessible at a time. In a preferred exemplary embodiment, as an alternative to this, a specific sample holder is provided that will be explained with reference to FIGS. 11A and 11B. FIG. 11A here shows a cross-sectional view of the photonic integrated circuit 29 together with the objective lens 28, the illumination beam path 212 and the detection light 63, and a sample holder 111, and FIG. 11B shows a corresponding plan view. In the exemplary embodiment of FIG. 11, the sample holder 111 includes a frame of mirrors or prisms that deflects light from the test apparatus of FIGS. 2-9 by approximately 90° and thus couples it into waveguide structures 110. The frame of mirrors is an example of a beam deflection device that is arranged around a receptacle for the photonic integrated circuit 29. The photonic integrated circuit 29 is to this end positioned in the frame after the dicing and possibly polishing of the end facets, with the result that light can be coupled in and out of waveguide structures. As is apparent in the plan view of FIG. 11B, locations 112 for input coupling and locations 113 for output coupling via scanning devices on the periphery (that is to say in prisms or mirror structures) can then be selected in order to couple light selectively into waveguide structures 110 and to selectively receive it so as to perform the previously discussed tests.

Figure 12:
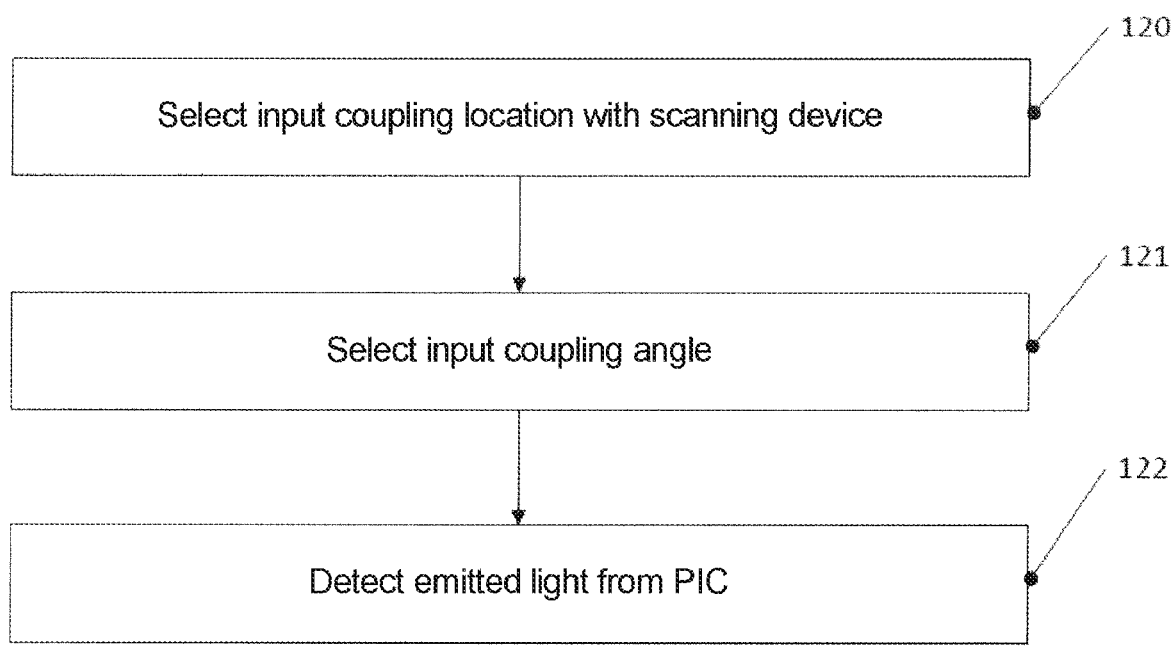
FIG. 12 shows a flowchart for elucidating a method in accordance with one exemplary embodiment.

FIG. 12 shows a flowchart for illustrating a method according to an exemplary embodiment. While the method in FIG. 12 is depicted as a sequence of steps, this should not be interpreted to be limiting because the depicted steps can in part alternatively take place at the same time or in a different sequence (in particular steps 120 and 121). The method of FIG. 12 will be described below with reference to the apparatuses of FIGS. 1-9 and can be implemented by way of the apparatuses, or be used independently thereof. Variations and modifications and also details that were described for the apparatuses are also correspondingly applicable to the method of FIG. 12.

In step 120, a coupling location for illumination light on a photonic integrated circuit is selected with a scanning device, for example the scanning device 11 in FIG. 1 or the scanning mirror 25 of FIGS. 2-9. It is additionally an option to select in step 121 an input coupling angle, for example by selecting a pupil for an illumination light beam, as described for the beamwalk device 22 of FIG. 2 or the spatial light modulator 31 of FIG. 3.

The method then furthermore includes in step 122 detecting of emitted light (detection light) from the photonic integrated circuit, wherein this can be effected areally or in spatially resolved fashion, as has likewise been described for the apparatuses of FIGS. 6-9.

In view of the many different described variants and exemplary embodiments, it is apparent that these serve only as examples and should not be interpreted to be limiting.

What is claimed is:

1. An apparatus, comprising:
a light source configured to produce an illumination light beam;
a scanning device in a path of the illumination light beam, the scanning device configured to select an illumination position of the illumination light beam on a photonic integrated circuit;
a detection device configured to detect detection light emanating from the photonic integrated circuit as a result of the illumination light illuminating the illumination position of the photonic integrated circuit; and
a pupil selection device configured to define a position of the illumination light beam in a pupil plane of the illumination path.

2. The apparatus of claim 1, wherein the pupil selection device comprises first and second adjustable mirror devices.

3. The apparatus of claim 2, wherein the pupil selection device comprises a spatial light modulator.

4. The apparatus of claim 1, wherein the pupil selection device comprises a spatial light modulator.

5. The apparatus of claim 4, wherein the spatial light modulator is configured to produce at least two illumination light beams.

6. The apparatus of claim 3, wherein the spatial light modulator is configured to produce at least two illumination light beams.

7. The apparatus of claim 1, wherein the detection device comprises a 2D detector.

8. The apparatus of claim 7, wherein the 2D detector comprises an image sensor.

9. The apparatus of claim 1, wherein the detection device comprises a point detector.

10. The apparatus of claim 1, wherein the detection device comprises at least one member selected from the group consisting of a spectrometer configured to operate in a time domain and an optical reflectometer configured to operate in a time domain.

11. The apparatus of claim 1, wherein the scanning device is in a path of the detection light.

12. The apparatus of claim 11, further comprising a second scanning device, wherein the second scanning device is in the path of the detection light.

13. The apparatus of claim 1, further comprising a second scanning device, wherein the second scanning device is in a path of the detection light from the photonic integrated circuit to the detection device.

14. The apparatus of claim 1, further comprising a coupling grating configured to be arranged on a surface of the photonic integrated circuit that is parallel with respect to a waveguide plane of the photonic integrated circuit.

15. The apparatus of claim 1, further comprising:
a receptacle configured to receive the photonic integrated circuit; and
a beam deflection device arranged around the receptacle, wherein the beam deflecting device is configured to deflect a light beam to or from the apparatus.

16. The apparatus of claim 15, wherein the beam deflection device comprises a member selected from the group consisting of a prism or a mirror.

17. The apparatus of claim 1, wherein the pupil selection device is configured so that, when the pupil selection device defines the position of the illumination light beam in the pupil plane of the illumination path, the pupil selection device sets an input coupling angle of the illumination light beam.

18. The apparatus of claim 1, wherein the scanning device comprises a member selected from the group consisting of a galvanic mirror and a micromechanical mirror.

19. A method, comprising:
using a scanning device to select an illumination location of an illumination light beam on a photonic integrated circuit;
detecting detection light coming from the photonic integrated circuit as a result of the illumination light beam illuminating the illumination location of the photonic integrated circuit;
selecting an input coupling angle of the light beam by setting a position of the illumination light beam in a pupil plane of an illumination path for the illumination light beam.

20. The method of claim 19, further comprising selecting a detection location for the detection light.

21. The method of claim 19, further comprising using a pupil selection device to set the position of the illumination light beam in the pupil plane of the illumination path for the illumination light beam.

\* \* \* \* \*

UNITED STATES PATENT AND TRADEMARK OFFICE
CERTIFICATE OF CORRECTION

PATENT NO. : 11,782,088 B2
APPLICATION NO. : 16/516400
DATED : October 10, 2023
INVENTOR(S) : Philipp Huebner and Stefan Richter It is certified that error appears in the above-identified patent and that said Letters Patent is hereby corrected as shown below:

In the Specification

Column 4, Line 29, delete "desireable" insert -- desirable --.

Signed and Sealed this
Fifth Day of December, 2023

Katherine Kelly Vidal
*Director of the United States Patent and Trademark Office*